(12) United States Patent
Sakurai et al.

(10) Patent No.: US 7,649,339 B2
(45) Date of Patent: *Jan. 19, 2010

(54) CALCULATING REMAINING BATTERY CAPACITY BASED ON BATTERY-SIDE END VOLTAGE AND DEVICE-SIDE END VOLTAGE

(75) Inventors: Masaki Sakurai, Tokyo (JP); Yukio Tsuchiya, Kanagawa (JP); Hideyuki Sato, Chiba (JP)

(73) Assignee: Sony Corporation (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/074,477

(22) Filed: Mar. 4, 2008

(65) Prior Publication Data

US 2008/0164848 A1 Jul. 10, 2008

Related U.S. Application Data

(63) Continuation of application No. 11/146,328, filed on Jun. 6, 2005, now Pat. No. 7,365,517.

(30) Foreign Application Priority Data

Jun. 4, 2004 (JP) .............................. 2004-167482

(51) Int. Cl.
*H01M 10/46* (2006.01)
(52) U.S. Cl. ...................................... 320/132
(58) Field of Classification Search ................. 320/107, 320/132, 149; 324/426, 430, 433
See application file for complete search history.

(56) References Cited

U.S. PATENT DOCUMENTS 5,619,117 A * 4/1997 Koenck ....................... 320/106
6,005,367 A   12/1999 Rohde
2002/0101218 A1* 8/2002 Koenck et al. .............. 320/140
2003/0169019 A1* 9/2003 Oosaki ....................... 320/132
2005/0154544 A1* 7/2005 Ono ............................. 702/63

FOREIGN PATENT DOCUMENTS

EP    0 502 623 A1    9/1992

(Continued)

*Primary Examiner*—Edward Tso
(74) *Attorney, Agent, or Firm*—Lerner, David, Littenberg, Krumholz & Mentlik, LLP

(57) ABSTRACT

A remaining battery capacity indicating apparatus includes an end voltage accumulated value setting unit operable to set an accumulated value indicative of a remaining capacity of a lithium-ion secondary battery, the accumulated value being set in a fully charged state of the battery so that the accumulated value reaches zero when a voltage in the battery is a device-side end voltage. It is determined whether a battery-side end voltage which ends discharges from the lithium-ion secondary battery corresponds to the device-side end voltage. If the battery-side end voltage does not correspond to the device-side end voltage, then the accumulated value is corrected in response to the device-side end voltage. A remaining capacity of the battery, corresponding to the device-side end voltage, is calculated based on the corrected accumulated value, and the calculated remaining capacity of the battery is displayed on a display unit. If the device-side end voltage does not correspond to the battery-side end voltage, then the remaining capacity of the battery is displayed on the device side.

5 Claims, 7 Drawing Sheets

FOREIGN PATENT DOCUMENTS

| | | |
|---|---|---|
| EP | 0 766 365 A1 | 4/1997 |
| EP | 0 794 438 A2 | 9/1997 |
| JP | 09-297166 A | 11/1997 |
| JP | 11-317246 A | 11/1999 |
| JP | 2000-019203 A | 1/2000 |
| JP | 2000-041341 A | 2/2000 |
| JP | 2000-260486 A | 9/2000 |
| JP | 2000-260488 A | 9/2000 |
| JP | 2002-112076 A | 4/2002 |

* cited by examiner

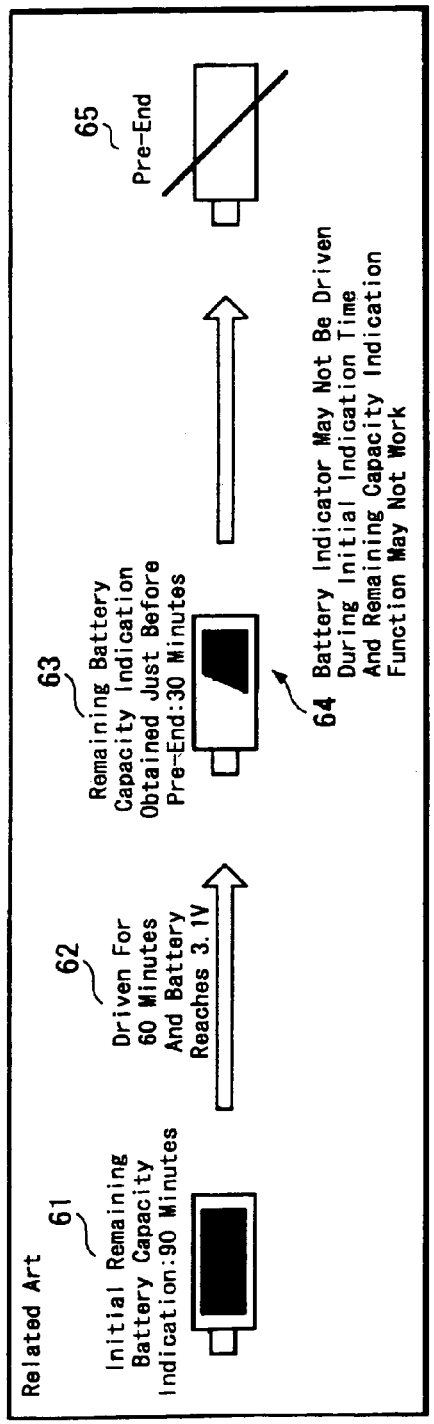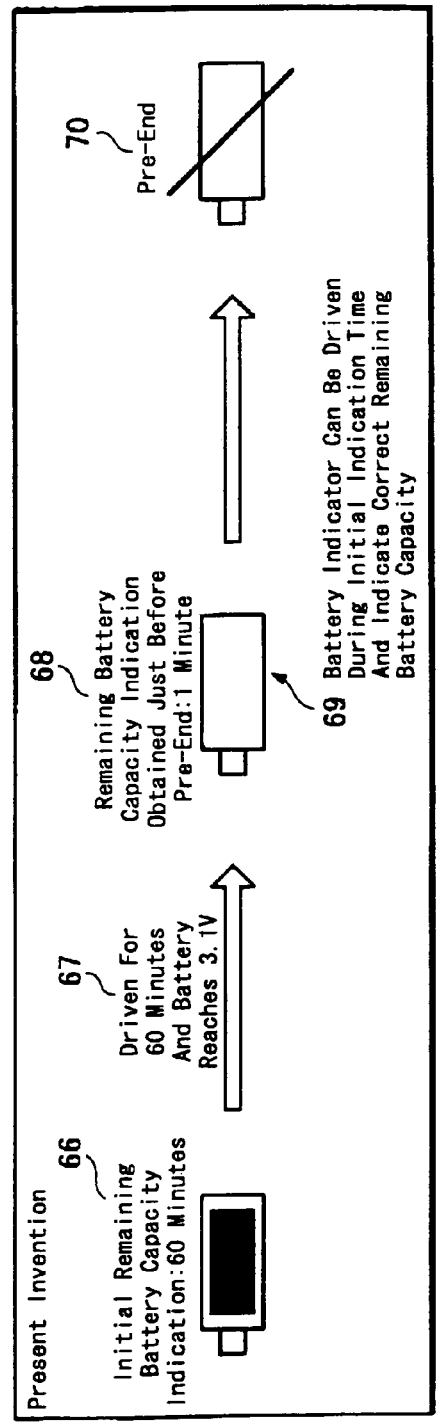
FIG. 3A (RELATED ART)
FIG. 3B

FIG. 6A ⟨Set Side⟩

FIG. 6B ⟨Battery Side⟩

CALCULATING REMAINING BATTERY CAPACITY BASED ON BATTERY-SIDE END VOLTAGE AND DEVICE-SIDE END VOLTAGE

CROSS-REFERENCE TO RELATED APPLICATIONS

The present application is a continuation of U.S. patent application Ser. No. 11/146,328, filed Jun. 6, 2005, which claims priority from Japanese Patent Application No. JP 2004-167482 filed on Jun. 4, 2004, the disclosures of which are hereby incorporated by reference herein.

BACKGROUND OF THE INVENTION

The present invention relates to a remaining battery capacity indicating apparatus and a remaining battery capacity indicating method suitable for use in indicating the remaining battery capacity of a charge and discharge battery which serves as a voltage supply for electronic devices.

Battery packs including a battery as a secondary cell such as a lithium-ion battery, a Ni—Cd battery and a nickel-hydrogen battery have been supplied so far. It is customary for this battery pack to include a microcomputer to calculate the remaining capacity of the battery and to communicate with an electronic device powered by the battery, peripheral circuits of the microcomputer, and a battery state detecting circuit required by the microcomputer to calculate the remaining capacity of the battery.

Such battery pack may not be charged and discharged endlessly. Also, the maximum number of charge and discharge cycles in which charge and discharge characteristics within a tolerance can be maintained is determined to a certain extent in response to the kind of the battery and the like.

As a technology capable of counting the maximum number of charge and discharge cycles to set the remaining battery capacity, the assignee of the present application has previously proposed a battery pack capable of counting the number of charge and discharge cycles in response to deteriorations of the battery when the battery is deteriorated by charging and discharging and which can accurately determine the remaining battery capacity in response to the deterioration of the battery, its charge and discharge counting method and a remaining capacity setting method of the battery pack (see Japanese Laid-Open Patent Application No. 2000-260486).

Also, as a technology for calculating the remaining battery capacity, the assignee of the present application has previously proposed a battery and a remaining battery capacity calculation method capable of accurately calculating the remaining battery capacity in response to a change of temperature when a temperature change occurs in the battery (see Japanese Laid-Open Patent Application No. 2000-260488).

FIG. 1 of the accompanying drawings is a diagram showing the relationship between a set end voltage and a battery end voltage according to the related art. In order to use an electronic still camera available as an electronic device having a battery mounted on its main body, as shown in FIG. 1, the battery end voltage in the electronic still camera is held at 3.0 V as shown by reference numeral 41 in FIG. 1 and the end voltage of the electronic still camera main body is held at 2.9V as shown by reference numeral 42. Hence, the battery can be used completely until the battery is dead.

However, when a battery having a discharge characteristic in which the battery end voltage is held at 2.6V, as shown by reference numeral 43 in FIG. 1, becomes commercially available on the market, since the related-art electronic still camera main body sets the end voltage to 2.9V because of the battery end voltage of the existing battery, the electronic still camera main body can use the battery at most up to the battery capacity of 2.9V.

As a result, it is to be assumed that the set end voltage will be ended not by the battery end voltage but by the end voltage of the electronic still camera main body. Thus, since the power supply from the battery is ended although some capacity of the battery still remains, there is a disadvantage that the remaining battery capacity time may not be indicated accurately.

FIG. 2 is a diagram showing characteristic curves obtained when discharge characteristics of existing cells and a next-generation cell were measured.

As shown in FIG. 2, when a cut-off voltage is held at 2.5V, while discharge capacities of existing batteries 51 and 52 fall within a range of from 2000 to 2300 [mAh], the discharge capacity of a battery 53 with a different discharge characteristic is increased as large as 2500 [mAh].

FIGS. 3A and 3B are, respectively, diagrams showing remaining battery capacity time indications obtained when a new alloy-based cell is employed by 2.6V-incompatible sets according to the related art and the present invention.

As shown in FIG. 3A, when the related-art 2.6V incompatible set uses the new alloy-based cell with such different discharge characteristic, an initial remaining battery capacity indication 61 indicates 90 minutes. An indication 62 indicates the state in which the end voltage reaches 3.1V after the set was driven for 60 minutes, and a remaining battery capacity indication 63 obtained just before pre-end indicates 30 minutes. However, as shown by an indication 64, the set side is not operated during the initial indication time corresponding to the battery side and the remaining battery capacity indication function may not be operated correctly. As a result, the indication goes to a pre-end indication 65 immediately.

Also, a related-art cell accumulated value characteristic 72 corresponding to the related-art cell discharge characteristic 71 shown in FIG. 4 may be computed by a microcomputer on the battery side. The related-art cell accumulated value characteristic 72 may be calculated in such a manner that it may reach zero when the related-art cell discharge characteristic 71 is changed from a related-art cell full charge accumulated value D12 to the end voltage of 2.9V.

In this case, as shown by reference numeral 75 in FIG. 4, when the related-art set employs a new cell with a discharge characteristic 73, the cell is forced to end at the voltage of 2.9V and hence the set side is ended although the accumulated value still remains. Consequently, the set side may use the new cell during the same discharge time period as the related-art cell discharge time T11.

SUMMARY OF THE INVENTION

In view of the aforesaid aspects, the present invention intends to provide a remaining battery capacity indicating apparatus and a remaining battery capacity indicating method in which the remaining capacity of a battery, corresponding to an end voltage of the battery, can be indicated on the side of an electronic device if the device-side end voltage and the battery side end voltage do not correspond to each other.

According to an aspect of the present invention, there is provided a remaining battery capacity indicating apparatus for detecting a remaining capacity of a charge and discharge battery serving as a power supply for supplying a voltage to an electronic device. The remaining battery capacity indicating apparatus includes an end voltage setting unit operable to set a device-side end voltage which ends operations of the electronic device; an accumulated value setting unit operable to set an accumulated value indicative of a remaining capacity of the battery, the accumulated value being set in a fully charged state of the battery so that the accumulated value reaches zero when a voltage in the battery is the device-side end voltage; a determining unit operable to determine whether a battery-side end voltage which ends discharges from the battery corresponds to the device-side end voltage; a correcting unit operable to correct the accumulated value in response to the device-side end voltage if the battery-side end voltage does not correspond to the device-side end voltage; a calculating unit operable to calculate a remaining capacity of the battery corresponding to the device-side end voltage based on the corrected accumulated value; and a display unit operable to display the calculated remaining capacity of the battery.

The remaining battery capacity indicating apparatus according to the present invention may further include a communication unit operable to transmit the device-side end voltage from the electronic device to a battery pack including the battery.

The remaining battery capacity indicating apparatus according to the present invention may further include a communication unit operable to transmit the corrected accumulated value from a battery pack including the battery to the electronic device.

In accordance with another aspect of the present invention, there is provided a method for detecting a remaining capacity of a charge and discharge battery serving as a power supply for supplying a voltage to an electronic device. The method includes setting a device-side end voltage which ends operations of the electronic device; setting an accumulated value indicative of a remaining capacity of the battery, the accumulated value being set in a fully charged state of the battery so that the accumulated value reaches zero when a voltage in the battery is the device-side end voltage; determining whether a battery-side end voltage which ends discharges from the battery corresponds to the device-side end voltage; correcting the accumulated value in response to the device-side end voltage if the battery-side end voltage does not correspond to the device-side end voltage; calculating a remaining capacity of the battery corresponding to the device-side end voltage based on the corrected accumulated value; and displaying the calculated remaining capacity of the battery.

The remaining battery capacity indicating method according to the present invention further includes transmitting the device-side end voltage from the electronic device to a battery pack including the battery.

Furthermore, the remaining battery capacity indicating method according to the present invention may include transmitting the corrected accumulated value from a battery pack including the battery to the electronic device.

In consequence, in an electronic still camera, for example, serving as an electronic device including a battery, data indicative of the remaining capacity of the battery is transmitted and received between the camera main body and the battery as an accumulated value, whereby the remaining capacity of the battery can be indicated correctly.

Also, since the remaining capacity of the battery can be indicated correctly regardless of the kind of battery, batteries of different kinds can be made compatible in the related-art electronic still camera main body. Further, related-art batteries can be made compatible in a new electronic still camera main body. Accordingly, since both the related-art battery and a new battery with a different discharge characteristic can match their remaining time capacity indications in response to the characteristics of both batteries so that the batteries can be used to the maximum, the remaining time in which the battery can be used to the maximum can be indicated on any kind of battery.

When a battery consisting of new cells with a different discharge characteristic in which a battery end voltage is held at 2.6V will be used in the future, as compared with that of the existing battery, since the end voltage is set to 2.9V in the related-art electronic still camera main body, the electronic still camera main body may use the battery up to 2.9V at the most. As a result, the power supply from the battery is ended although the battery has still capacity left and a problem arises in which the battery remaining time may not be indicated correctly.

However, according to the present invention, both in the related-art battery and the new battery with the different discharge characteristic, and both in the related-art electronic still camera main body and the new electronic still camera main body, the remaining use times of the batteries can be calculated in response to the characteristics of the respective batteries and the batteries can be used to the maximum.

However, since the related-art apparatus and the battery may be made compatible (upper compatibility), it becomes possible to use the apparatus and the battery without damaging other functions.

BRIEF DESCRIPTION OF THE DRAWINGS

FIGS. 3A and 3B are diagrams showing battery remaining time indications obtained when a 2.6V incompatible set uses a new alloy-based battery, wherein FIG. 3A shows the battery remaining time indications according to the related art and FIG. 3B shows the battery remaining time indications according to the present invention, respectively;

FIGS. 6A and 6B are flowcharts to which reference will be made in explaining remaining battery time indicating operations, wherein FIG. 6A shows the operations of remaining battery time indications on the apparatus (set) side and FIG. 6B shows the operations of remaining battery time indications on the battery side, respectively.

DETAILED DESCRIPTION

The present invention will now be described with reference to the accompanying drawings.

While a so-called info-lithium battery for transmitting and receiving information between it and an electronic device, including a microcomputer and a digital still camera, will be described by way of example, it is needless to say that the present invention may not be limited thereto.

Figure 5:
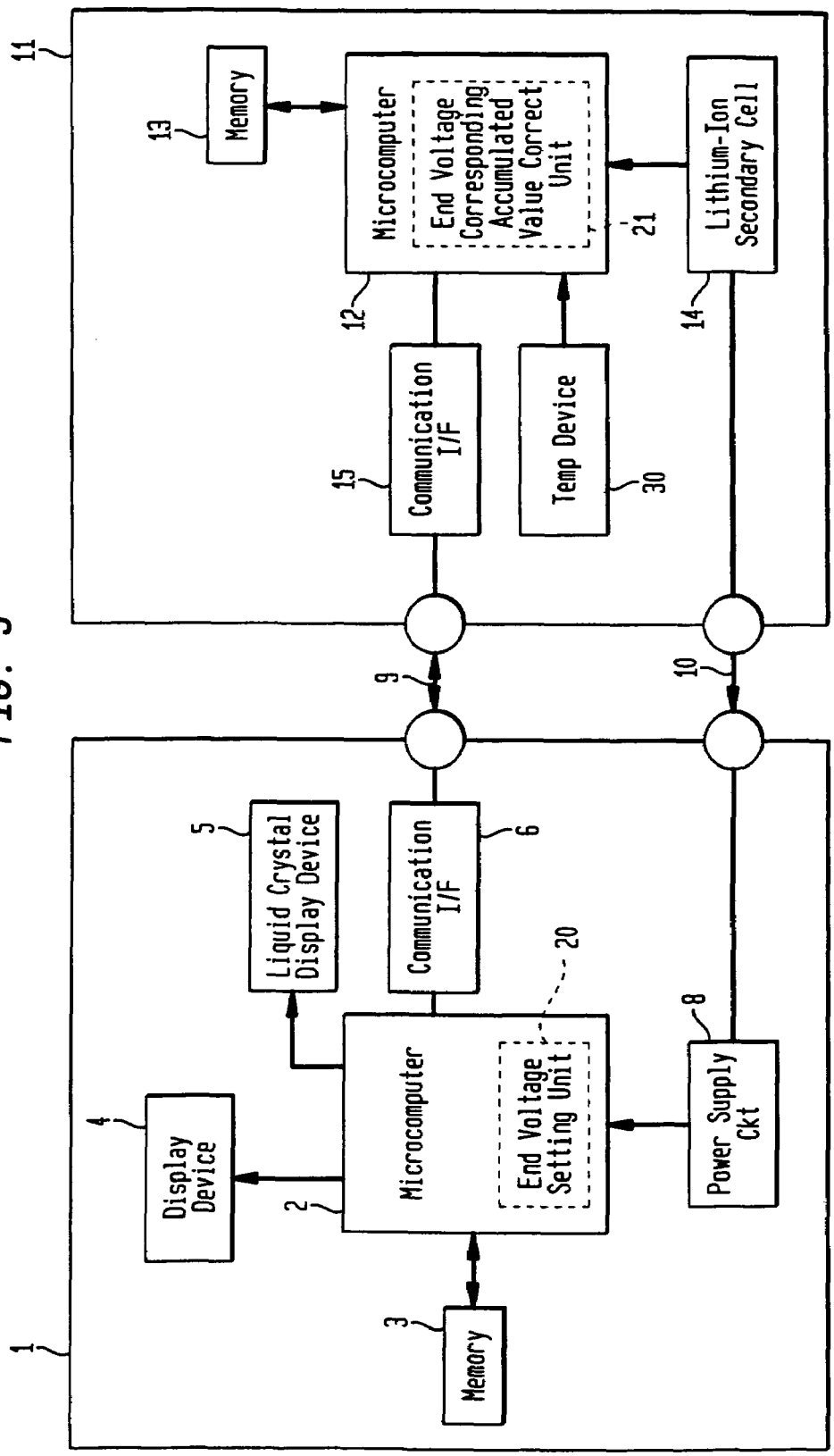
FIG. 5 is a block diagram showing the connections between an apparatus main body and a battery according to an embodiment of the present invention.

FIG. 5 is a schematic block diagram showing the connections between an apparatus main body and a battery according to an embodiment of the present invention.

The embodiment of the present invention can be applied to a battery pack of a battery side 11 connected to a video camera apparatus on an apparatus side 1, as shown in FIG. 5, for example.

As shown in FIG. 5, the battery pack 11 is attached to a battery attachment portion of the video camera apparatus 1, for example, through a channel 9, and a power supply voltage is supplied to the video camera apparatus 1 from a lithium-ion secondary battery 14 through a memory 13, a microcomputer 12 and a communication interface 15.

On the other hand, the battery pack 11 may be connected to a charging circuit 8 connected to an AC adapter (not shown) of the video camera apparatus 1 to supply power to the battery pack through a charging path 10. Hence, under control of the microcomputer 2 and the memory 3, the lithium-ion secondary battery 14 in the battery pack 11 is charged by a charging voltage through the charging path 10.

In addition to the voltage from the lithium-ion secondary battery 14, an apparatus side end voltage, an accumulated value indicative of a battery remaining capacity, a battery end voltage and the like may be transmitted and received between the battery pack 11 and the video camera apparatus 1 serving as a usable device through the channel 9.

Thus, an end voltage corresponding accumulated value correction control unit 21 of the microcomputer 12 in the battery pack 11 sets an accumulated value from the accumulated value required in full charge when the end voltage is the device side end voltage so that the accumulated value indicative of the remaining battery capacity of the battery may reach zero. Also, it is determined by the end voltage corresponding accumulated value correction control unit 21 whether the battery side end voltage set by the discharge characteristic of the battery to end the discharge from the battery and the device side end voltage correspond to each other. If it is determined by the end voltage corresponding accumulated value correction control unit 21 that the battery side end voltage and the device side end voltage do not correspond to each other, then the end voltage corresponding accumulated value correction control circuit 21 corrects the accumulated value in response to the battery side end voltage.

Concurrently therewith, an end voltage setting unit 20 within the microcomputer 2 of the video camera apparatus 1 calculates the battery remaining capacity corresponding to the device side end voltage based on the corrected accumulated value, sets an end voltage which is used to supply power supply voltages into the apparatus, and also indicates the thus calculated battery remaining capacity and the end voltage on a display device 4 and a liquid-crystal display device 5.

Power supply voltages supplied to the inside of the video camera apparatus 1 may be control voltages required by the microcomputer 2 to write data in the memory 3 and to read data from the memory 3, control and drive voltages required to record image data obtained from a camera unit (not shown) on a recording medium of a recording unit (not shown), drive voltages required by the camera unit (not shown) to move a lens into and out of the camera unit and the like.

In the embodiment of the present invention, the end voltage corresponding accumulated value correction control unit 21 of the microcomputer 12 in the battery pack 11 has functions of an accumulated value setting means for setting an accumulated value obtained from the full charged state so that an accumulated value indicative of the remaining capacity of the battery may reach zero when the end voltage is the device side end voltage, a judging means for determining whether the battery side end voltage set by the discharge characteristic of the battery to end the discharge from the battery and the device side end voltage correspond to each other, and a correcting means for correcting an accumulated value in response to the device side end voltage if the battery side end voltage and the device side end voltage do not correspond to each other.

Also, the end voltage setting unit 20 within the microcomputer 2 of the video camera apparatus 1 has functions of an end voltage setting means for setting the device side end voltage to end the operations of the electronic device and a calculating means for calculating a battery remaining capacity corresponding to the device side end voltage based on the thus corrected accumulated value. Further, the liquid-crystal display device 5 and the display device 4 have display means functions to display the thus calculated battery remaining capacity.

Operations of the apparatus main body and the battery having the above-mentioned arrangement according to the embodiment of the present invention will be described with reference to FIG. 5 and the flowcharts of FIGS. 6A and 6B.

Figure 6:
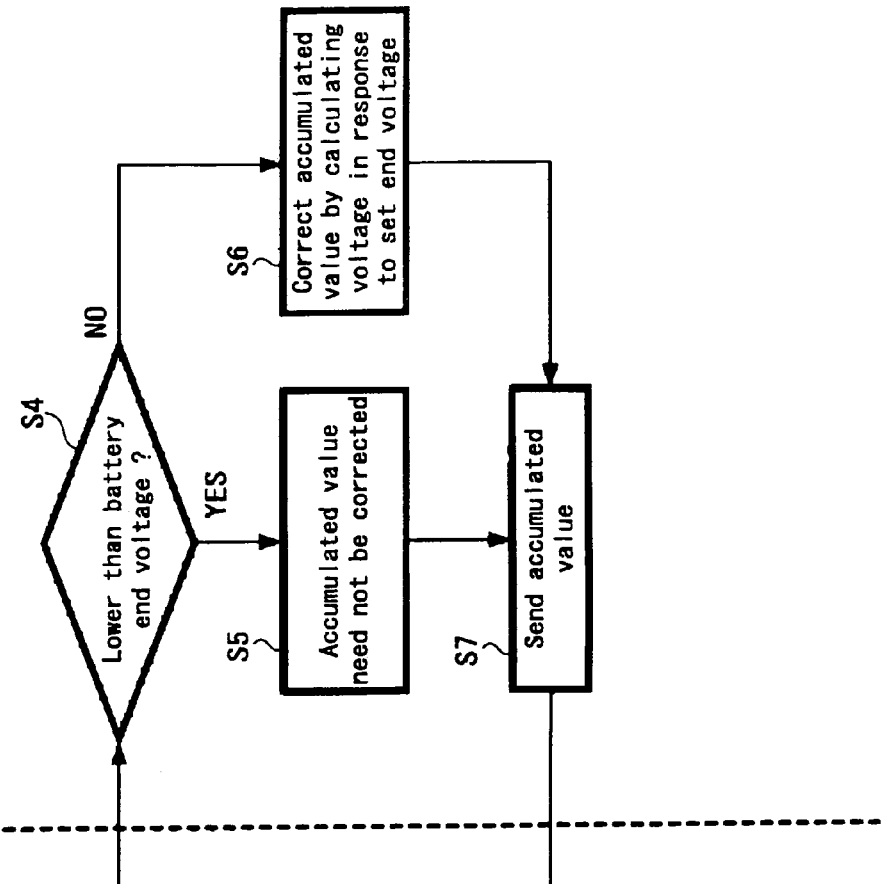

FIGS. 6A and 6B are flowcharts to which reference will be made in explaining the manner in which a remaining battery capacity time is indicated, wherein FIG. 6A is a flowchart showing operations of the apparatus side (that is, set side) and FIG. 6B is a flowchart showing operations of the battery side.

Referring to FIG. 5 and FIGS. 6A and 6B, the video camera apparatus 1 is energized at step S1. Then, control goes to step S2, at which the microcomputer 12 in the battery pack 11 and the microcomputer 2 in the video camera apparatus 1 communicate with each other through the communication interfaces 6, 15 and the channel 9.

Then, control goes to step S3, at which the microcomputer 2 in the video camera apparatus 1 supplies a device side end voltage (that is, set side end voltage) to the microcomputer 12 of the battery pack 11.

Then, control goes to the next decision step S4, at which it is determined by the microcomputer 12 of the battery pack 11 whether the battery side end voltage set by the discharge characteristic of the battery to end the discharge from the battery and the device side end voltage correspond to each other. If the battery side end voltage and the device side end voltage do not correspond to each other as represented by a NO at the decision step S4, then control goes to step S6, at which the accumulated value is corrected in response to the device side end voltage. Then, control goes to step S7, at which the thus corrected accumulated value is transmitted to the microcomputer 2 of the video camera apparatus 1.

In the decision step S4, it is determined whether the battery side end voltage and the device side end voltage correspond to each other, more specifically, it is determined whether the device side end voltage is lower than the battery side end voltage.

Only if the battery side end voltage and the device side end voltage do not correspond to each other as shown by a NO at the decision step S4, more specifically, only if the device side end voltage is higher than the battery side end voltage, does control go to step S6, at which the accumulated value may be corrected.

If the battery side end voltage and the device side end voltage correspond to each other as shown by a YES at the decision step S4, more specifically, if the device side end voltage is lower than the battery side end voltage, then control goes to step S5, at which the accumulated value need not be corrected.

Then, control goes to step S7, at which the microcomputer 12 in the battery pack 11 transmits to the microcomputer 2 in the video camera apparatus 1 the accumulated value corrected such that the battery side end voltage and the device side end voltage may correspond to each other. Then, the microcomputer 2 in the video camera apparatus 1 can receive data of the corrected accumulated value at step S8. Then, control goes to step S9, at which the microcomputer 2 in the video camera apparatus 1 calculates a battery charging time based on the data of the corrected accumulated value transmitted from the microcomputer 12 in the battery pack 11. Then, control goes to step S10, at which a remaining battery minutes (battery remaining capacity time) may be indicated on the liquid-crystal display device 5 or a battery end voltage can be calculated. When the battery is charged, a charging LED (light-emitting diode) (not shown) of the display device 4 can be lit or the full charged state can be detected.

As described above, in an electronic still camera main body using a battery consisting of new cells, the end voltage of the electronic still camera is transmitted to the battery. Thus, when the battery is attached to an electronic still camera main body whose end voltage is less than 2.6V, the accumulated value is adjusted such that the accumulated value reaches zero at the voltage of 2.6V and the adjusted accumulated value is output to the electronic still camera main body.

When the end voltage of the electronic still camera main body is not written or the end voltage of the electronic still camera main body is higher than 2.6V, the accumulated value is adjusted such that it may reach zero at the end voltage of 2.9V and the adjusted accumulated value is output to the electronic still camera main body.

As a consequence, it becomes possible for a related-art device and a new device to use a new battery without mismatching. Further, when the device has the above-mentioned functions, even if a new battery with a different end voltage is developed, the existing device may use such new battery without mismatching.

The above-mentioned threshold value of the end voltage can be varied in response to the characteristics of the battery. That is, while the threshold value of the end voltage is set to 2.6V as set forth above, the present invention is not limited thereto and it is needless to say that the threshold value of the end voltage may be changed variously.

Figure 7:
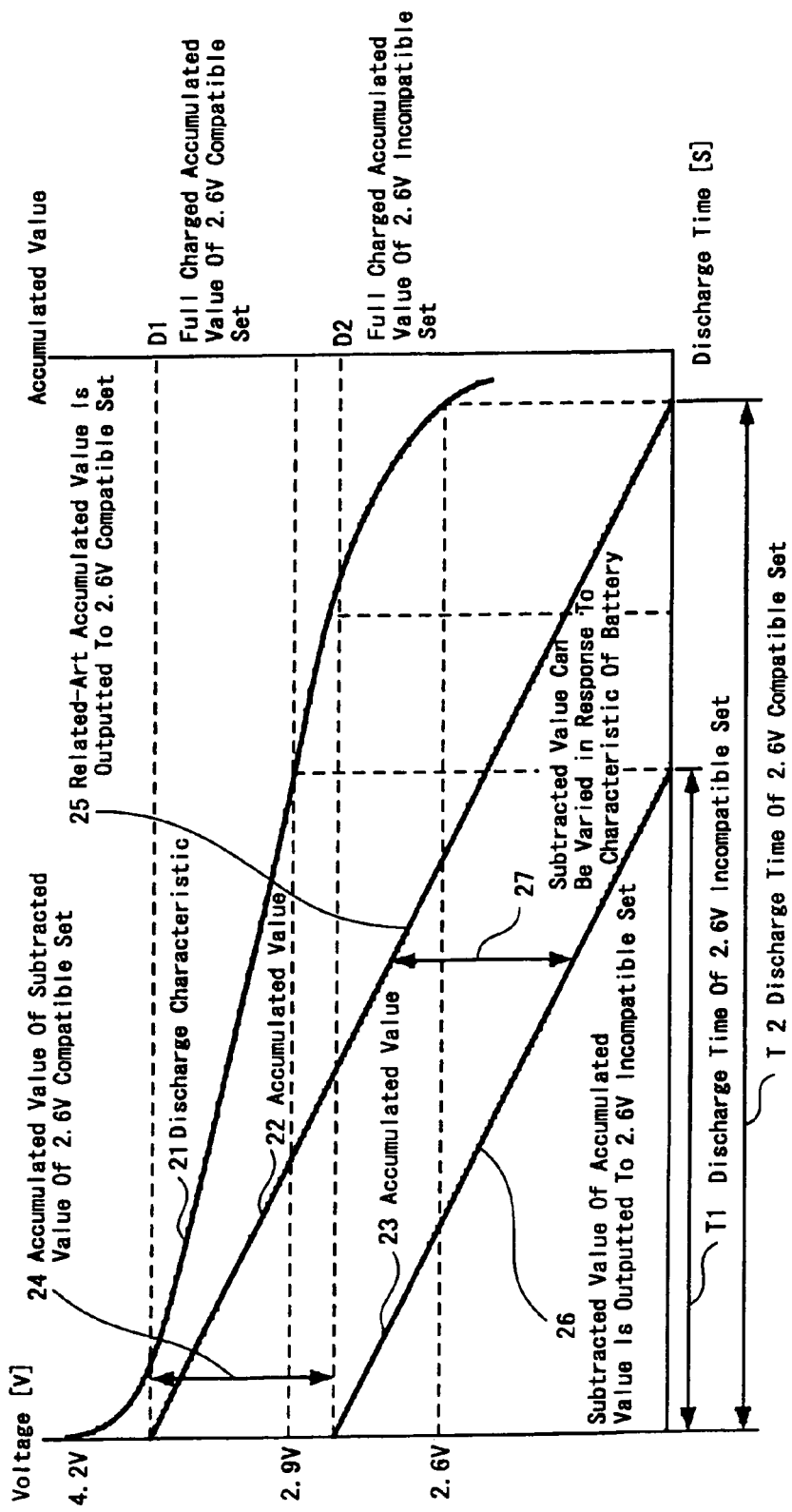
FIG. 7 is a diagram showing new cell discharge characteristics and the accumulated values that are output.

FIG. 7 is a diagram showing characteristic curves obtained when discharge characteristics and accumulated values of a new battery and a related-art battery were measured.

As shown in FIG. 7, a new battery discharge characteristic 21 becomes a characteristic ranging from 4.2V at the fully charged voltage to 2.6V at the end voltage. At that time, the characteristic of a new battery accumulated value corresponding to the new battery discharge characteristic 21 is calculated by the microcomputer 12 of the battery side (battery pack 11). The characteristic 22 of the new battery accumulated value is calculated in such a manner that the fully charged accumulated value D1 of a new battery in a 2.6V compatible set may reach zero when the new battery discharge characteristic 21 reaches the end voltage 2.6V.

The battery outputs an accumulated value based on the new battery accumulated value characteristic 22 to the 2.6V compatible set as shown by the characteristic curve 25.

However, for the 2.6V incompatible set, a new battery accumulated value characteristic corresponding to the 2.6V incompatible set is calculated by the microcomputer 12 of the battery side (battery pack 11) as shown by the characteristic curve 23. The new battery accumulated value characteristic 23 corresponding to the 2.6V incompatible set is calculated in such a manner that it may reach zero when the end voltage changes to 2.9V from a new battery fully charged accumulated value D2 in the 2.6V incompatible set.

The microcomputer 12 on the battery side (battery pack 11) calculates a subtracted value obtained when the new battery fully charged accumulated value D2 in the 2.6V incompatible set is subtracted from the new battery fully charged accumulated value D1 in the 2.6V compatible set as shown by the characteristic curve 24. Then, the calculated value of the subtracted value is output from the battery to the 2.6V incompatible set as shown by the characteristic curve 26.

Also, as shown by the characteristic curve 27, the subtracted value obtained when the new battery fully charged accumulated value D2 in the 2.6V incompatible set is subtracted from the new battery fully charged accumulated value D1 in the 2.6V compatible set can be changed in response to the discharge characteristic of the battery.

Thus, when the 2.6V compatible set uses a new battery having the discharge characteristic shown by the characteristic curve 21, the set side can extend the end voltage to 2.6V and hence it can use the remaining accumulated value effectively. Accordingly, when the set side uses the new battery, the set side can effectively use the accumulated value until a discharge time T2 of the 2.6V compatible set which is longer than the discharge time T1 of the 2.6V incompatible set.

Referring back to FIG. 3B, when the related-art set uses a new alloy-based battery with a different discharge characteristic, an initial remaining battery capacity indication indicates 60 minutes. Then, the remaining battery capacity indication 67 shows the state in which the end voltage reaches 3.1V after the apparatus was driven for 60 minutes, and a remaining battery capacity indication 68 obtained just before the pre-end becomes one minute. As shown by a remaining battery capacity indication 69, the set side can be driven during the initial display time corresponding to the battery side. Hence, a correct remaining battery capacity indicating function can be demonstrated and the battery indication battery can be set to a pre-end indication 70.

Figure 1:
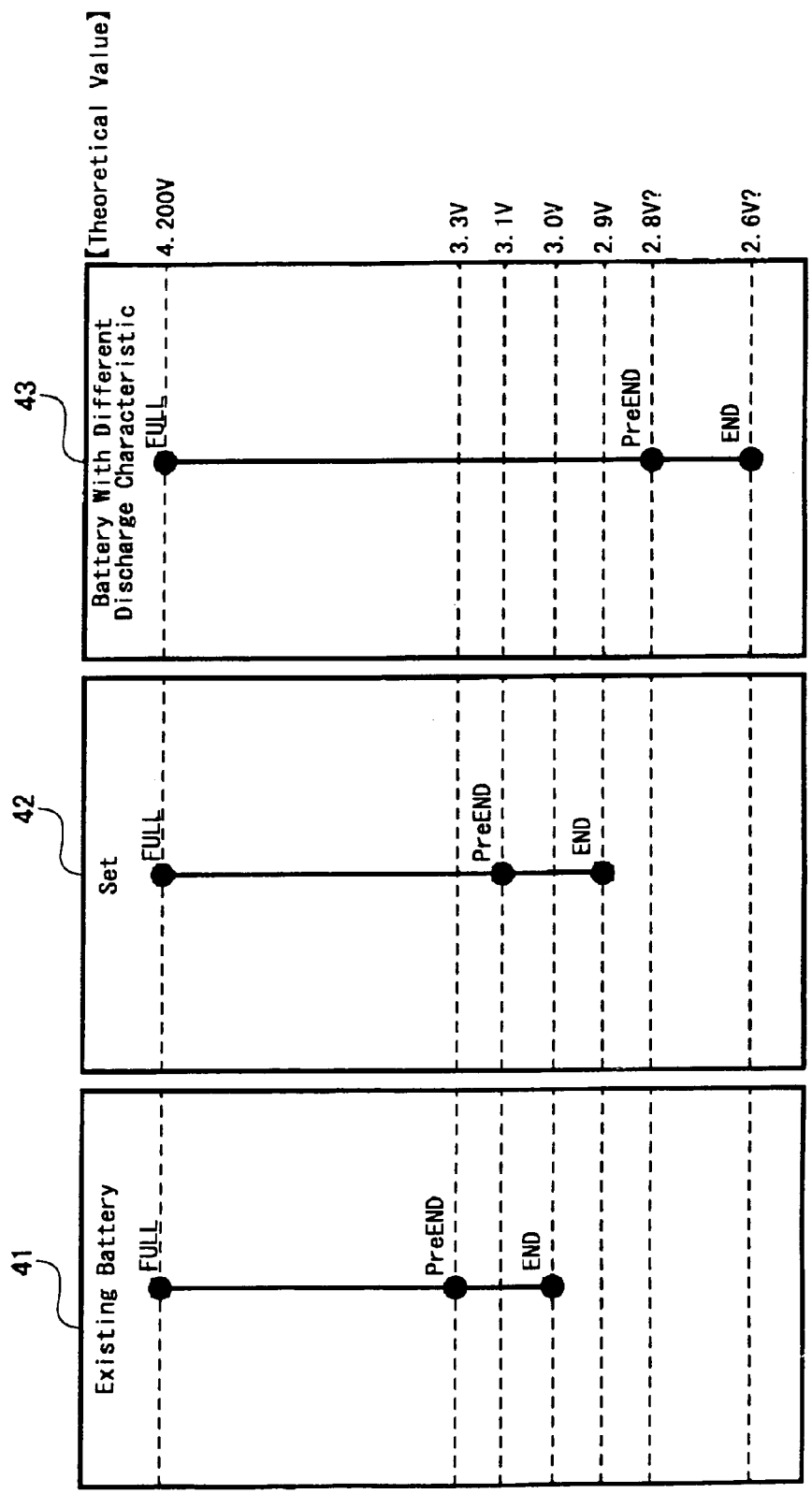
FIG. 1 is a diagram showing the relationship between a set end voltage and a battery end voltage according to the related art.
Figure 2:
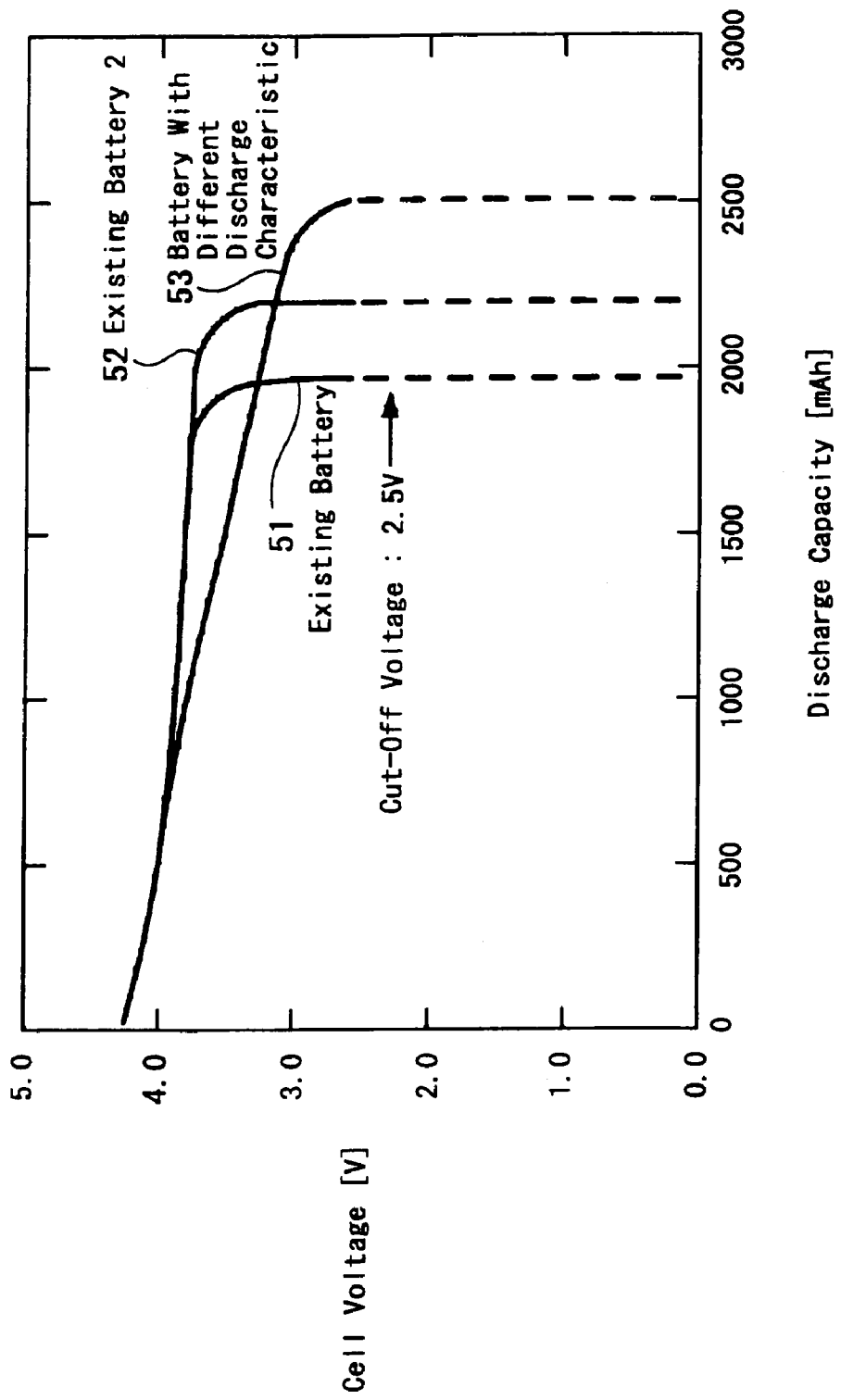
FIG. 2 is a diagram showing characteristic curves obtained when discharge characteristics of existing batteries and the discharge characteristic of the next-generation battery were measured.
Figure 4:
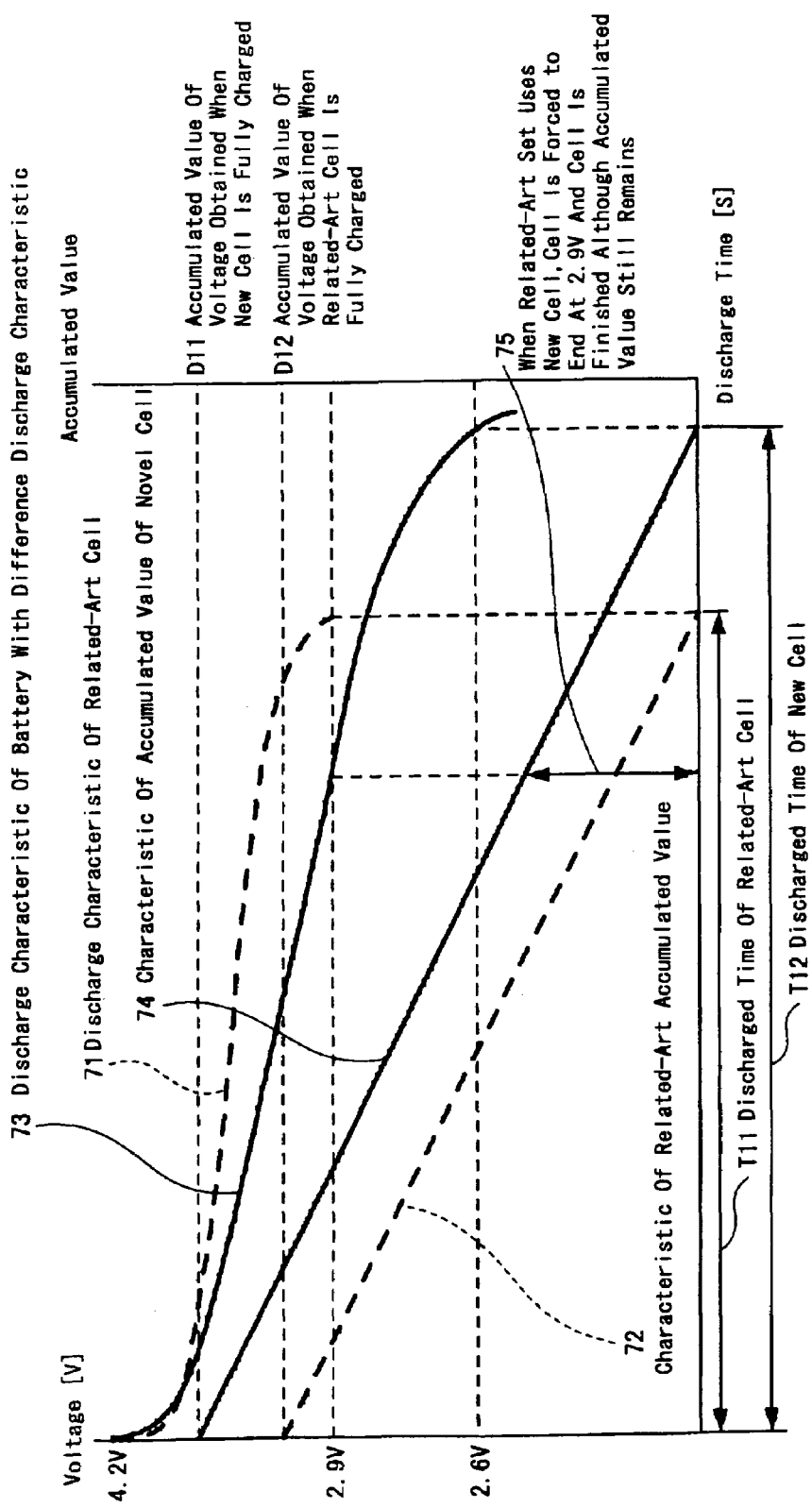
FIG. 4 is a diagram showing characteristic curves obtained when the discharge characteristics of a related-art cell and a new cell were measured.

Also, a new battery accumulated value characteristic 74 corresponding to the discharge characteristic 73 of the battery with the different discharge characteristic in FIG. 4 may be calculated by the microcomputer 12 on the battery side (battery pack 11). As shown in FIG. 4, the new battery accumulated value characteristic 74 is calculated in such a manner that it may reach zero when the new battery discharge characteristic 73 is changed from a new battery fully charged accumulated value D11 to the end voltage 2.6V.

In this case, since the end voltage may be extended to 2.6V when the related-art set uses the new battery with the discharge characteristic 73, the remaining accumulated value can be used effectively as shown by reference numeral 75. Accordingly, when the set side uses the new battery, the set side can use the new battery until a new cell discharge time T12 which is longer than a related-art battery discharge time T11.

When a battery consisting of new cells with a different discharge characteristic in which a battery end voltage is held at 2.6V will be used in the future, since the end voltage is set to 3.0V in the related-art electronic still camera main body as compared with that of the existing battery, the electronic still camera main body may use the battery up to 3.0V at the most. As a result, the power supply from the battery is ended although the battery still has capacity left, and a problem arises in which the battery remaining time may not be indicated correctly.

However, according to the present invention, both in the related-art battery and the new battery with the different discharge characteristic and both in the related-art electronic still camera main body and the new electronic still camera main body, the remaining battery times of the batteries can be calculated in response to the characteristics of the respective batteries and the batteries can be used to the maximum.

However, since the related-art apparatus and the battery may be made compatible (upper compatibility), it becomes possible to use the apparatus and the battery without damaging other functions.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A system for detecting a remaining battery capacity, comprising:
   an electronic device and a battery connected together including:
      a power supplying means for supplying power to the electronic device;
      a storage means for at least one of storing a battery-side end voltage which is set based on a discharge characteristic of the power supplying means and storing a device-side end voltage which ends operations of the electronic device;
      a sending means for at least one of sending an accumulated value indicating a remaining capacity of the power supplying means to the electronic device and sending the device-side end voltage stored on the storage means;
      a receiving means for at least one of receiving the device-side end voltage and receiving the accumulated value for indicating a remaining capacity of the battery from the battery;
      a control means for at least one of controlling correcting of the accumulated value based on the device-side end voltage received from the receiving means and the battery-side end voltage stored on the storage means, and send the corrected accumulated value to the electronic device and controlling displaying of the remaining capacity of the battery based on the accumulated value received from the battery;
   wherein the battery provides power to the electronic device and is capable of sending the accumulated value to the electronic device and the accumulated value is corrected based on the device-side end voltage which ends operations of the electronic device and the battery-side end voltage is set based on a discharge characteristic of the battery; and
   wherein the electronic device sends a device-side end voltage which ends operations of the electronic device to the battery device and calculates the remaining capacity of the battery device based on the accumulated value received from the electronic device.

2. The system according to claim 1, wherein the control means corrects the accumulated value in case the device-side end voltage is higher than the battery-side end voltage.

3. An electronic device to which a battery is connected, the battery provides power to the electronic device and sending an accumulated value to the electronic device, the accumulated value is corrected based on a device-side end voltage which ends operations of the electronic device and a battery-side end voltage which is set based on a discharge characteristic of the battery, comprising:
   a power supplying means for power being supplied by the battery connected to the electronic device;
   a storage means for storing the device-side end voltage which ends operations of the electronic device;
   a sending means for sending the device-side end voltage stored on the storage means;
   a receiving means for receiving the accumulated value for indicating a remaining capacity of the battery from the battery; and
   a display control means for controlling displaying of the remaining capacity of the battery based on the accumulated value received from the battery.

4. A battery device which is connected to an electronic device, the electronic device sends a device-side end voltage which ends operations of the electronic device to the battery device and calculates a remaining capacity of the battery device based on an accumulated value received from the electronic device, comprising;
   a battery cell;
   a power supplying means for supplying power to the electronic device;
   a sending means for sending an accumulated value indicating a remaining capacity of the battery cell to the electronic device;
   a receiving means for receiving the device-side end voltage;
   a storage means for storing a battery-side end voltage which is set based on a discharge characteristic of the battery cell; and
   a control means for controlling correcting of the accumulated value based on the device-side end voltage received from the receiving means and the battery-side end voltage stored on the storage means, and send the corrected accumulated value to the electronic device.

5. The battery device according to claim 4, wherein the control means corrects the accumulated value in case the device-side end voltage is higher than the battery-side end voltage.

* * * * *